US012507514B2

(12) United States Patent
Pinos et al.

(10) Patent No.: US 12,507,514 B2
(45) Date of Patent: Dec. 23, 2025

(54) SPACER MICRO-LED ARCHITECTURE FOR MICRODISPLAY APPLICATIONS

(71) Applicant: PLESSEY SEMICONDUCTORS LTD, Plymouth (GB)

(72) Inventors: Andrea Pinos, Plymouth (GB); Samir Mezouari, Plymouth (GB); WeiSin Tan, Plymouth (GB); John Lyle Whiteman, Plymouth (GB)

(73) Assignee: Plessey Semiconductors Ltd, Plymouth Devon (GB)

( * ) Notice: Subject to any disclaimer, the term of this patent is extended or adjusted under 35 U.S.C. 154(b) by 378 days.

(21) Appl. No.: 17/926,538

(22) PCT Filed: May 28, 2021

(86) PCT No.: PCT/GB2021/051330
§ 371 (c)(1),
(2) Date: Nov. 18, 2022

(87) PCT Pub. No.: WO2021/245388
PCT Pub. Date: Dec. 9, 2021

(65) Prior Publication Data
US 2023/0207753 A1    Jun. 29, 2023

(30) Foreign Application Priority Data
Jun. 3, 2020   (GB) .................... 2008330

(51) Int. Cl.
*H10H 20/855* (2025.01)
*H10H 20/841* (2025.01)
(Continued)

(52) U.S. Cl.
CPC ........ *H10H 20/855* (2025.01); *H10H 20/841* (2025.01); *H10H 20/857* (2025.01);
(Continued)

(58) Field of Classification Search
None
See application file for complete search history.

(56) References Cited

U.S. PATENT DOCUMENTS

| 2007/0087616 A1* | 4/2007 | Sakakura | ........... H10D 86/0231 |
| | | | 439/395 |
| 2019/0019783 A1 | 1/2019 | Tangring | |

(Continued)

FOREIGN PATENT DOCUMENTS

| CN | 103219441 A | 7/2013 |
| JP | 2007335731 A | 12/2007 |

(Continued)

OTHER PUBLICATIONS

International Search Report and Written Opinion in PCT International Application No. PCT/GB2021/051330 mailed Sep. 14, 2021.

*Primary Examiner* — Nicholas J Tobergte
(74) *Attorney, Agent, or Firm* — Cognition IP, P.C.; Edward Steakley

(57) ABSTRACT

A method of forming an optical device, the method comprising the steps of forming spacers on the substantially vertical sidewalls of a sacrificial mesa, the spacers being formed from a first electrically insulating, optically transparent material, and having an internal face contacting the mesa, and a second opposing external face; depositing a reflective, electrically conducting material so as to form a mirror layer on the external face of the spacers; removing the sacrificial mesa so as to form a pocket between the internal faces of the spacers; installing a die having substantially vertical sidewalls into the pocket between the internal faces of the spacers.

20 Claims, 17 Drawing Sheets

(51) Int. Cl.
*H10H 20/857* (2025.01)
*H10H 20/01* (2025.01)
(52) U.S. Cl.
CPC ....... *H10H 20/034* (2025.01); *H10H 20/0363* (2025.01); *H10H 20/0364* (2025.01)

(56) References Cited

U.S. PATENT DOCUMENTS

2019/0165226 A1   5/2019   Kim et al.
2020/0127177 A1   4/2020   Bradl

FOREIGN PATENT DOCUMENTS

KR    20090090812 A    8/2009
KR     100973259 B1    8/2010

* cited by examiner

SPACER MICRO-LED ARCHITECTURE FOR MICRODISPLAY APPLICATIONS

CROSS-REFERENCE TO RELATED APPLICATIONS

This application is a 35 U.S.C. § 371 national stage application of PCT International Application No. PCT/GB2021/051330, filed on May 28, 2021, which claims the benefit of Great Britain Application No. 2008330.9, filed Jun. 3, 2020, which are hereby incorporated by reference in their entirety.

FIELD OF THE INVENTION

The invention relates to methods of forming light emitting devices. In particular, but not exclusively, the invention relates to light emitting devices with optimised light extraction.

BACKGROUND OF THE INVENTION

It is known that light emitting diode (LED) devices provide efficient sources of light for a wide range of applications. Increases in LED light generation efficiency and extraction, along with the production of smaller LEDs (with smaller light emitting surface areas) and the integration of different wavelength LED emitters into arrays, has resulted in the provision of high quality colour arrays with multiple applications, in particular in display technologies.

Several display technologies are being considered and used for Micro LED Displays for use in various applications, including Augmented Reality, Merged Reality, Virtual Reality and Direct view displays, such as Smart Watches and Mobile devices. Technologies such as Digital Micro Mirrors (DMD) and Liquid Crystal on Silicon (LCoS) are based on reflective technologies, where an external light source is used to produce Red, Green and Blue photons in time sequential mode and the pixels either divert the light away from an optical element (DMD) or absorb light (LCoS) to adjust the brightness of a pixel in order to form an image. Liquid Crystal Displays (LCD) typically use a back light, an LCD panel on an addressable back plane and colour filters to produce an image. A back plane is required to turn individual pixels on and off and to adjust the brightness of individual pixels for each frame of video. Increasingly, emissive display technologies such as Organic Light Emitting Diode (OLED) or Active Matrix OLED (AMOLED) and more recently, Micro LED as they offer lower power consumption for untethered micro display applications and higher image contrast. Micro LED, in particular, offers higher efficiency and better reliability than micro OLED and AMOLED displays.

The invention being described in this document relates to a method for making a highly efficiency micro LED array combining techniques to improve Internal Quantum Efficiency (IQE) and Light Extraction Efficiency (LEE) to improve efficiency and brightness figures of merit.

Structures deigned to increase light extraction efficiency are well known in the LED industry, including the use of a pseudo parabolic shaped MESA, to direct photons, generated in the multiple quantum wells (MQW), to an emitting surface.

The technique used to fabricate a MESA with such a shape involves a technique such as Reactive Ion Etch (RIE) or Inductively Coupled Etch (ICP). In such etch techniques, a high energy plasma comprising RF, high voltage (DC bias) and reactive gases, often including free radicals, is used to selectively etch the semiconducting material. The features are defined using a photolithographic process using a photo sensitive material to define areas which will be subject to the etch process and area which will remain un-etched. The precise shape of the MESA can be controlled by the profile of the photo sensitive material used to define the pattern and by etch pressure, power, gas flow and gas species.

Not only does this complicate the manufacturing process, but as a result of this etch process, the edge of the MESA can become damaged which affects the IQE of the micro LED.

As shown in FIG. 1, as DC bias and Plasma density increases, more damage is done to the edge of the feature leading to surface leakage path formed by crystal damage, nitrogen vacancies and dangling bonds. Dry etching generates many crystal defects due to the high energy ion bombardment at the surface. Dangling bonds are easily oxidized and crystal damage generates many defect levels in the energy bands which act as carrier recombination centers at the surface, leading to non-radiative recombination.

The surface recombination velocity (non-radiative recombination velocity) is faster than the radiative recombination velocity in the bulk MQW, therefore the small micro LED is vulnerable to surface recombination and a consequential reduction in IQE.

A widely reported consequence of the damage caused during MESA etch is efficiency reduction with smaller micro LED dimensions, as shown in FIG. 2. External Quantum Efficiency (EQE) is the product of internal quantum efficiency IQE (the ratio of the number of photons generated to the number of electrons) and the light extraction efficiency LEE (the ability to extract light out of from the p-n junction into the surroundings). The mechanism that drives this trend is the ratio of the perimeter of the micro LED to the area. As the micro LED reduces in size, the area of the sidewall increases in relation to the area of the MQWs so the surface leakage path at the edge of the micro LED causes increases in non-radiative recombination.

The efficiency of micro LEDs can be significantly increased by repairing the damage caused by the MESA etch, as shown in FIG. 3. It is typically possible to effect a 10-fold improvement in EQE by executing an optimized damage repair regime. The peak EQE increases after damage repair and the peak EQE occurs at a lower current density so that at the typical operating conditions, a 10-fold increase in efficiency can be obtained. Such a regime, is not compatible however with preserving a MESA shape which is optimized for high LEE, as the repair process removes the semiconductor material which is damaged by the MESA etch, as shown in FIG. 4.

SUMMARY OF THE INVENTION

In order to mitigate for at least some of the above-described problems there is provided a method of forming one or more optical devices in accordance with the appended claims. Further, there is provided an optical device in accordance with the appended claims.

In a first aspect of the invention, there is provided a method of manufacturing an optical device, the method comprising the steps of (a) forming spacers on the substantially vertical sidewalls of a sacrificial mesa, the spacers being formed from a first electrically insulating, optically transparent material, and having an internal face contacting the mesa, and a second opposing external face; (b) depositing a reflective metallic layer so as to form a mirror layer on the external face of the spacers; (c) removing the sacrificial mesa so as to form a pocket between the internal faces of the spacers; and (d) installing a die having substantially vertical sidewalls into the pocket between the internal faces of the spacers.

Advantageously, the spacer material acts as an optical component to enhance light extraction from the die, whilst the metallic material acts as mirror layer on the sides of the spacers further enhancing light extraction.

Preferably the external faces of the spacers are angled relative to the internal faces.

Preferably the external faces of the spacers have a pseudo-parabolic profile. The parabolic shape works to direct emitted photons towards the light emitting surface of the device such that they are incident on said surface at an angle of incidence below the critical angle, thereby allowing photons to be extracted into air at a high frequency.

Preferably the profile of the external faces of the spacers approximate a Bézier curve having two control points with a Bezier coefficient of 0.5. This has been found to provide the maximum light extraction.

Preferably the spacers are forms of silicon nitride, silicon oxide or tin oxide.

Preferably the method further comprises the step of depositing a transparent conducting oxide over the die and spacers, which forms an electrical contact to the underlying die as well providing protection.

Preferably the transparent conducting oxide is indium tin oxide.

Preferably the transparent conducting oxide forms an electrical contact to the die, and a second electrical contact is formed on the opposing surface of the die.

Preferably the method further comprises the step of forming a light extraction feature on the transparent conducting oxide above the underlying die. The light extraction feature provides a further enhancement to the optical properties of the device.

Preferably the light extraction feature is in the form of convex lens.

Preferably the method further comprises the step of depositing a second electrically insulating, optically transparent material on the external face of each of the spacers, the second electrically insulating, optically transparent material having a different refractive index to that of the first electrically insulating, optically transparent material. This allows for the use of materials with graduated indices of refraction, such that the emitted photons can be better directed towards the light emitting surface.

Preferably the refractive index of the first material is greater than that of the second material such that light is increasingly reflected back towards the light emitting surface of the optical device Preferably the method further comprises the step of applying index-matching material filler between the die and the internal faces of the spacers.

Preferably the sacrificial mesa is first created by forming two trenches either side of a designated region in a layer of sacrificial material.

Preferably the reflective metallic layer is further deposited along the exposed bottom portion of each of the trenches so as to act as a current spreading layer to the transparent conducting oxide.

Preferably the method further comprises the step of filling the trenches with an insulating material.

Preferably the die comprises an n-doped layer, a p-doped layer, and an active region configured to emit light when electrical current is applied to the die.

Preferably the sidewalls of the die are coated in an optically transparent, electrically insulating material.

In a second aspect of the invention there is provided an optical device manufactured according to steps (a)-(c), as well as any of the further steps described above.

DETAILED DESCRIPTION OF AN EMBODIMENT OF THE INVENTION

A detailed description of embodiments of the invention is described, by way of example only, with reference to the figures, in which.

Figure 1:
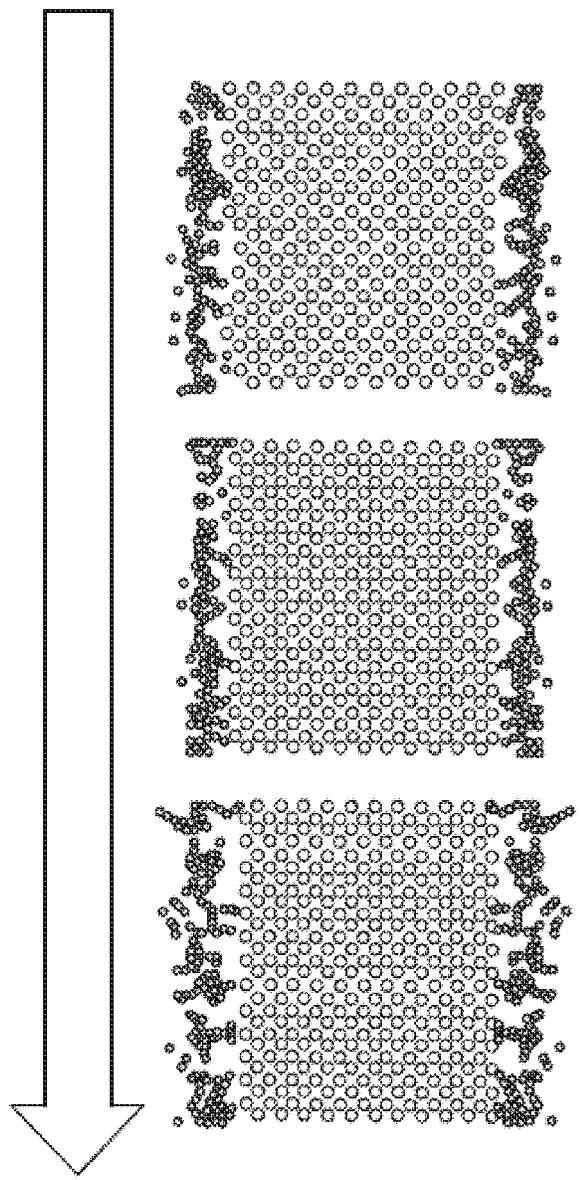
FIG. 1 shows a crystal damage to InGaN material with increasing plasma power and DC bias.
Figure 2:
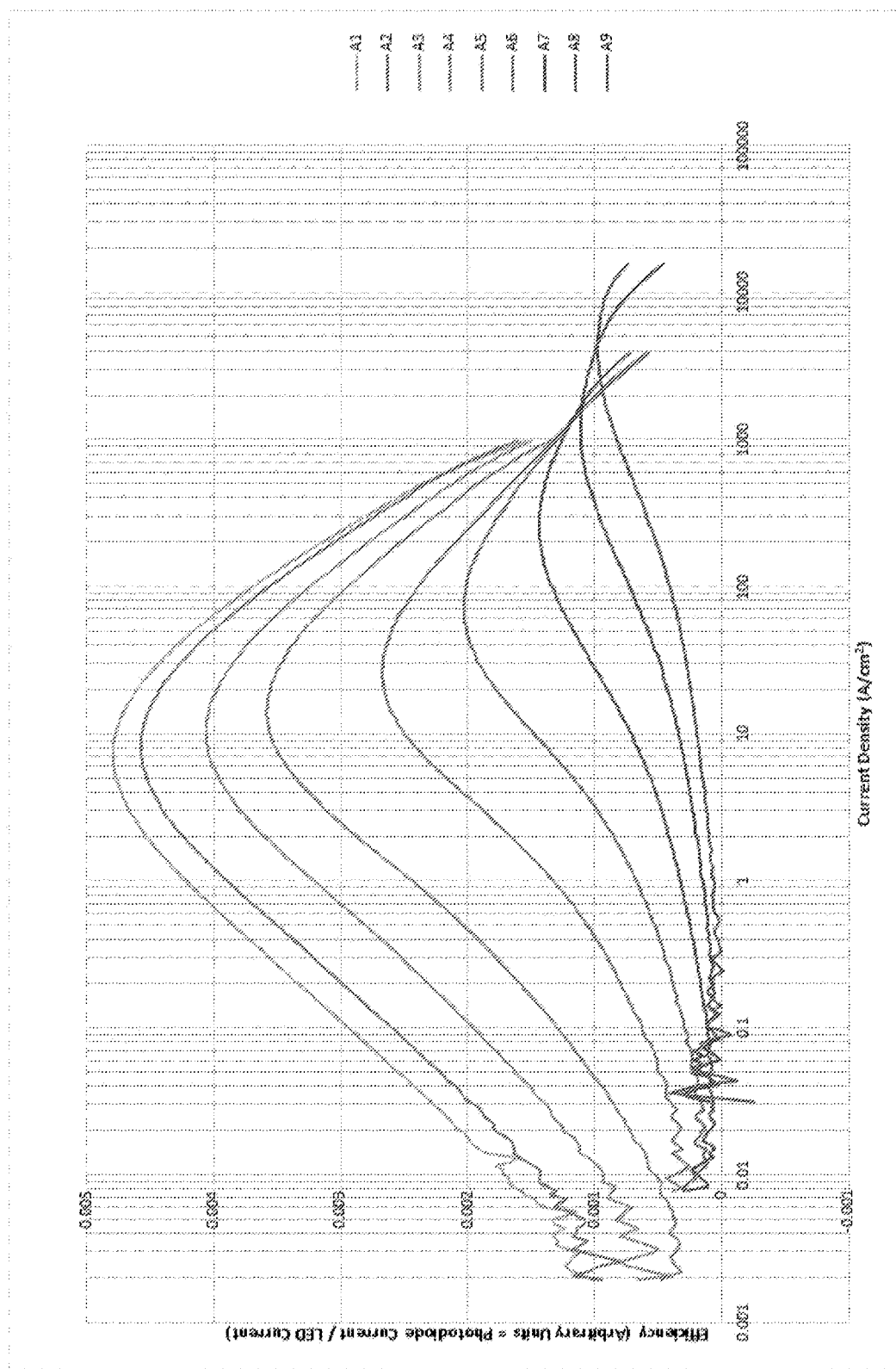
FIG. 2 shows external quantum efficiency (EQE) vs current density for micro LED sizes reducing from A1 (256 µm) to A9 (1 µm).
Figure 3:
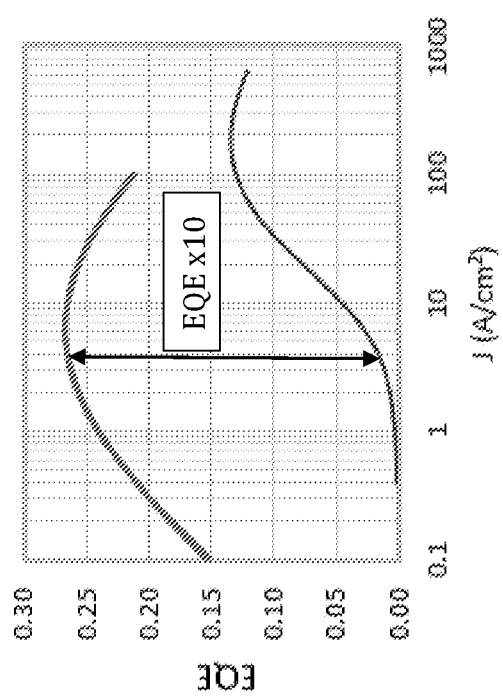
FIG. 3 shows the EQE of a micro LED with and without MESA damage reduction and repair.
Figure 4:
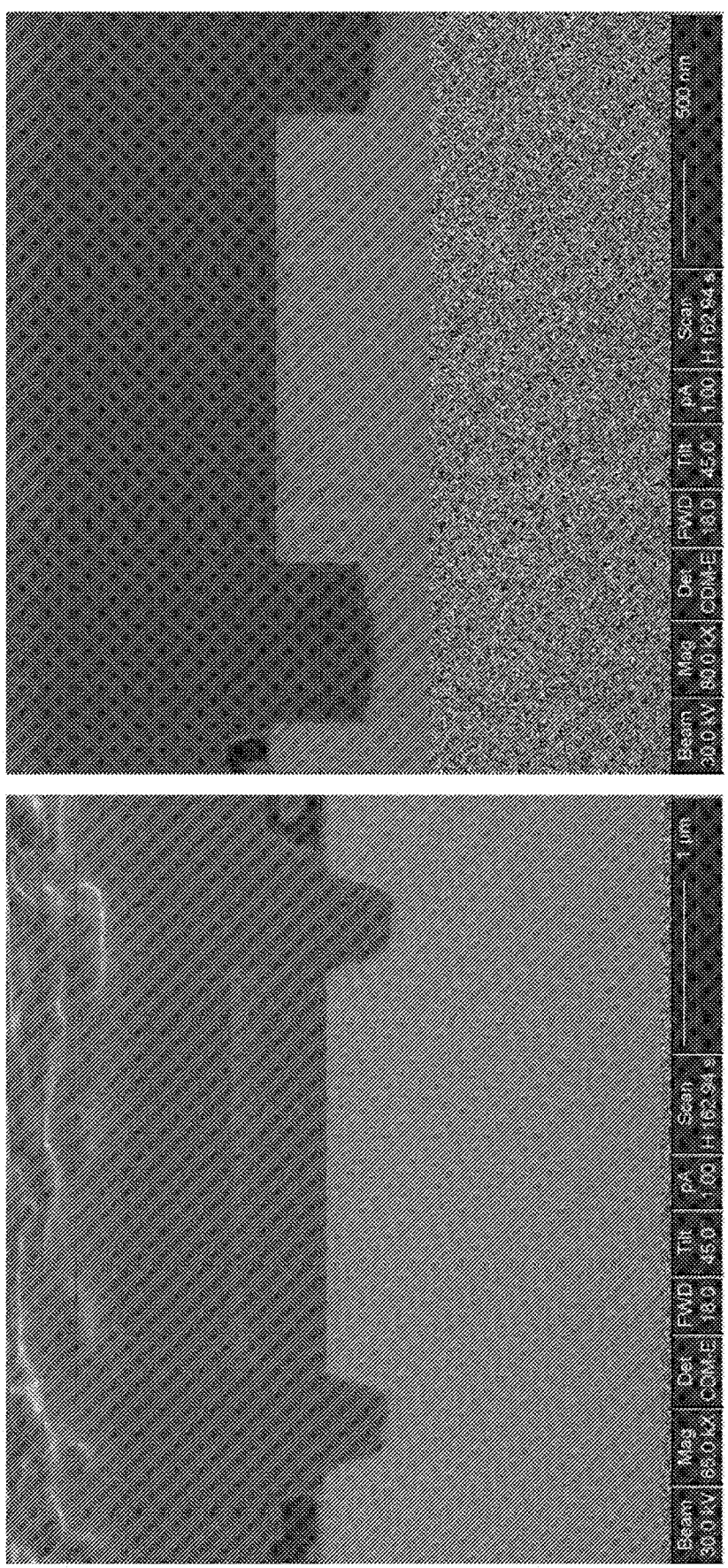
FIG. 4 shows a cross section of an etched MESA, pre (a) and post (b) damage repair process.
Figure 5A:
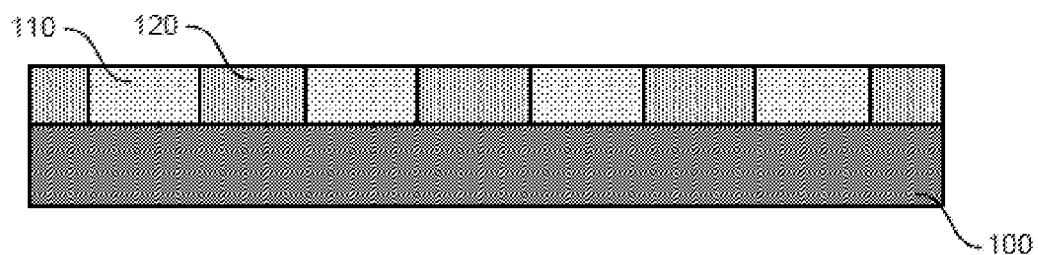
FIGS. 5-10 show the stages of the monolithic manufacturing process for the optical devices.

FIG. 5(a) depicts a preliminary stage in the manufacturing process wherein a CMOS wafer 100 is prepared having a top layer composed of alternating metal 110 and oxide 120 regions. This structure is formed by known means.

Figure 5B:
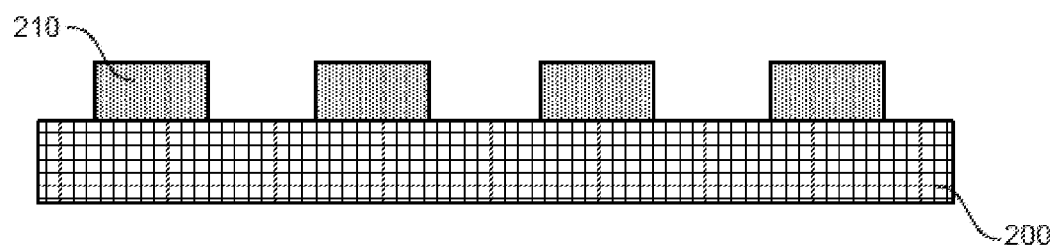

At the stage shown in FIG. 5(b), a separate carrier wafer 200 is prepared having a routinely spaced mesas formed of a sacrificial material 210. In an embodiment the sacrificial material is metal. In an alternative embodiment the sacrificial material is photoresist. In a further embodiment the sacrificial material is a LED chip. The skilled person appreciate that any suitable (i.e. easily patternable/positionable and removable) material may be employed for this purpose.

Figure 5C:
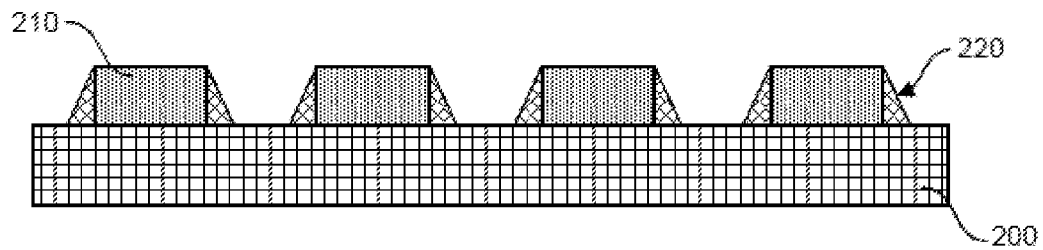

At the stage shown in FIG. 5(c), optically transparent, electrically insulating spacers 220 are formed on the sidewalls of each of the sacrificial mesas 210, the spacer material having an index of refraction $n_1$. Whilst the spacers 220 are illustrated having a sloped profile, they may also be parabolic. In an embodiment the spacers are formed by depositing a conformal coating of silicon dioxide via a known process and the resulting film is etched back using RIE etch to form uniform spacers 220. In alternative embodiments, the spacers are formed via different known dry etch processes, or via nanoimprint lithography or an embossing process. In a further embodiment the spacers are formed from silicon nitride or titanium oxide.

Figure 6A:
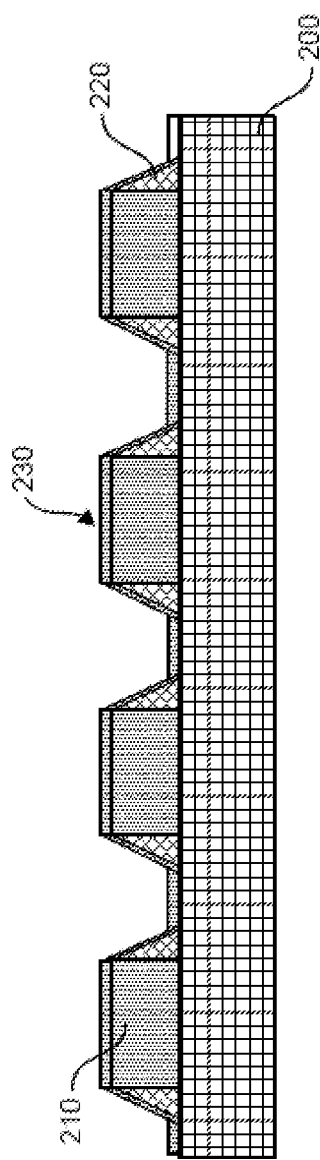

At the stage shown in FIG. 6(a) a reflective, electrically conducting material 230 is conformally deposited across the upper surface of the carrier wafer 200, spacers 220 and sacrificial mesas 210. In an embodiment, the reflective, electrically conducting material 230 is a metal. In an embodiment, the reflective, electrically conducting material 230 is formed from aluminium and has a surface roughness of Ra=50 nm. In a preferred embodiment the reflective, electrically conducting material 230 has a surface roughness of Ra<10 nm. In an embodiment, the reflective, electrically conducting material 230 is deposited by a sputtering process, though the skilled person would be aware that any suitable material and/or depositing process may be employed.

Figure 6B:
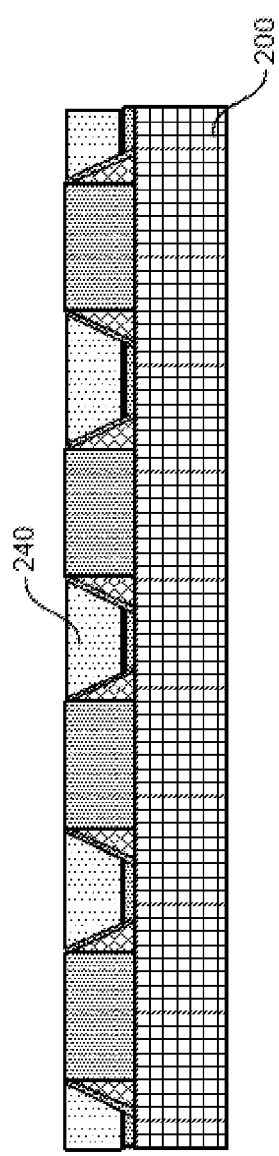

At the stage shown in FIG. 6(b), a silicon dioxide layer 240 is deposited and chemically mechanically polished such that it fills the voids between subsequent sacrificial mesas 210. The skilled person would again appreciate that any suitable insulating material could be used.

Figure 7:
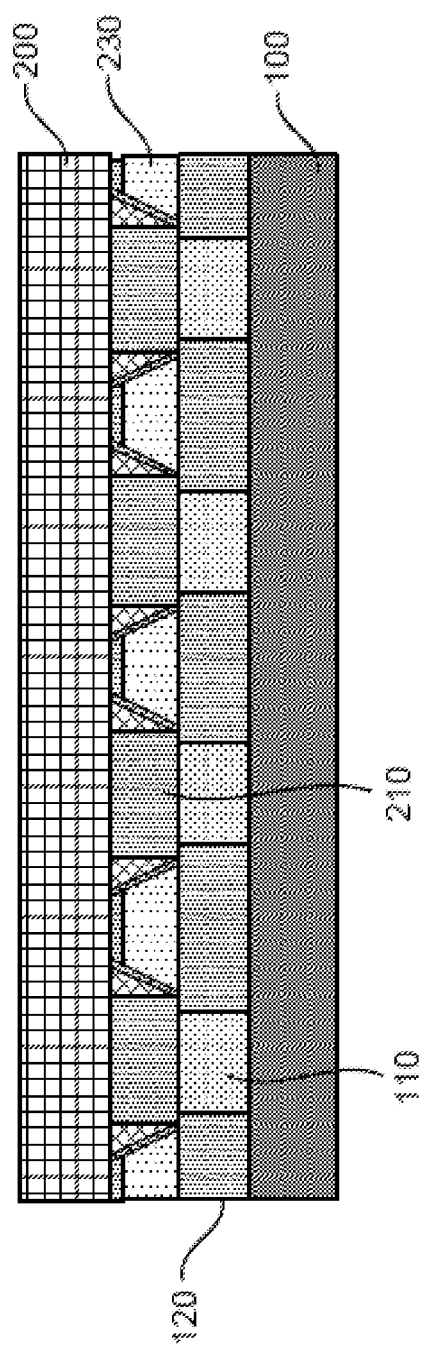

At the stage shown in FIG. 7, the carrier wafer 200 is inverted and subsequently bonded to the CMOS wafer 100 of FIG. 5 such that the metal regions 110 on the surface of the CMOS wafer 100 line up with the sacrificial mesas 210 of the carrier wafer 200. Bond adhesion is achieved using the silicon dioxide layer 240 by means known to the skilled person.

Figure 8A:
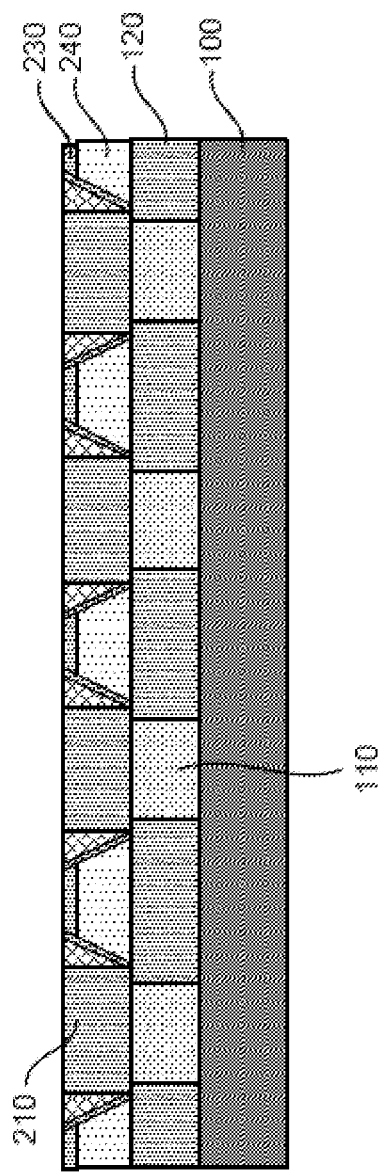
Figure 8B:
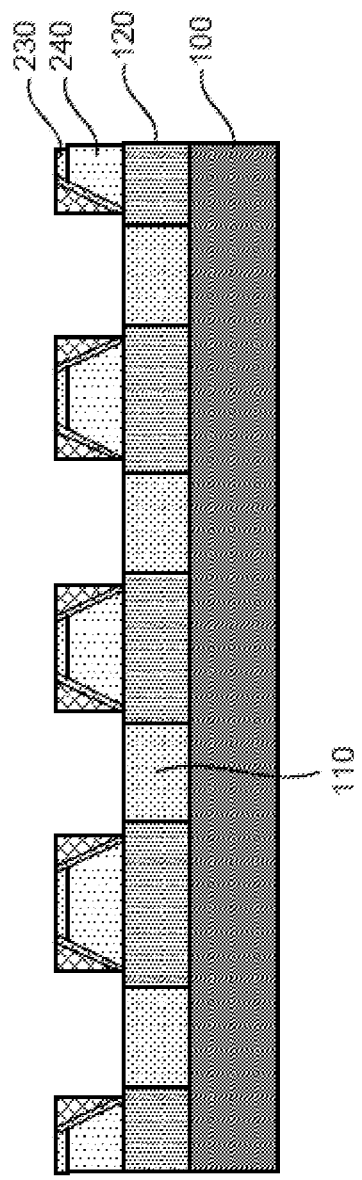

At the stages shown in the FIGS. 8(a) and 8(b), the carrier wafer 200 is removed by known means (such as a wet or dry etch) along with the underlying sacrificial mesas 210 and the corresponding portion of the reflective electrically conducting material 230, thereby creating pockets to receive light emitting structures such as dies 300.

Figure 9A:
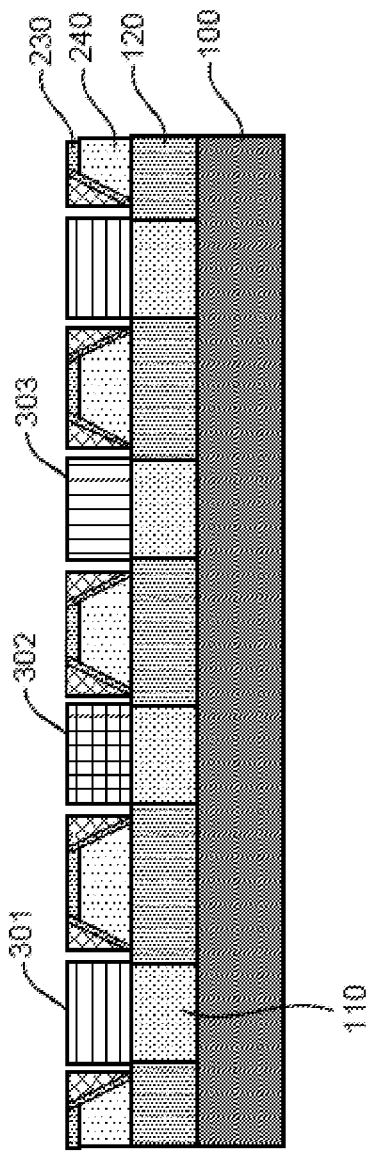

At the stage shown in FIG. 9(a), light emitting structures in the form of individual LED dies 301, 302 and 303 are installed in the pockets such that the vertical sidewalls of the dies fit between and run parallel to the vertical sidewalls of the spacers 220 left by the removal of the sacrificial mesas 210. The bottom face of each die is in contact with a corresponding metal region 110 of the CMOS wafer, thus forming an addressable electrical contact between to each die. In an embodiment, the vertically of the die sidewalls is achieved via a wet chemical etch, though the skilled person would know of other methods that could be applied employed to this end. In the illustrated embodiment, the dies are positioned such that they alternate in colour from red 301, to green 302, to blue 303—the skilled person would however understand that any pattern of dies could be used depending on the ultimate application, with a further example provided in FIG. 12.

Figure 9B:
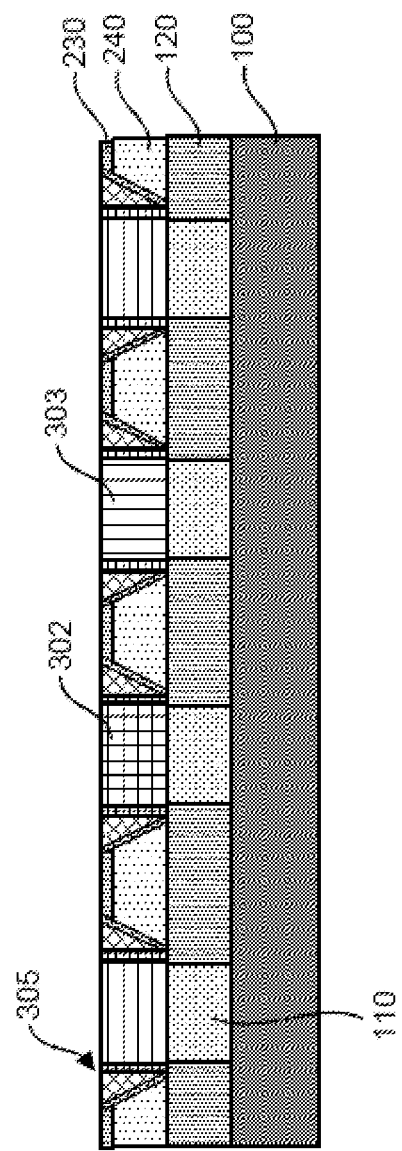

At the stage shown in FIG. 9(b), index matching material 305 (i.e. material having a refractive index matching that of the spacers 220) is applied to fill any gaps between the dies 300 and the spacers 220 either side. Multiple alternative index matching material will be known to the skilled person, and the selection of a particular material will naturally depend on the material used to form the spacers 220.

Figure 10A:
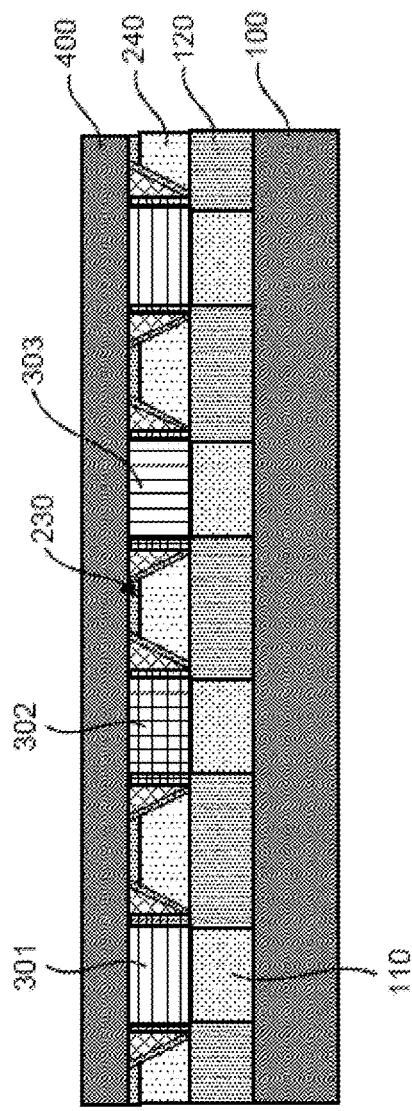

At the stage shown in FIG. 10(a), a blanket transparent conducting oxide layer 400 is applied to the topmost surface via a known process, covering the dies 300 and spacers 220. In an embodiment, the transparent conducting oxide is formed of indium tin oxide (ITO), though the skilled person would understand that any suitably transparent and conducting material could be used. The application of the transparent conducting oxide layer 400 provide a common electrode for each of the underlying dies, with the reflective, electrically conducting material 230 applied between successive spacers 220 acting as a current spreading layer across the transparent conducting oxide layer 400.

In order to further increase the light extraction efficiency, the refractive index of the transparent conductive oxide 400 may be varied through variation in the porosity of the transparent conductive oxide. One known method for varying the porosity of a transparent conductive oxide, such as ITO, is oblique-angle deposition using electron-beam evaporation. By varying the angle of the deposition surface relative to the vapour flu deposition, the amount of shadow cast by as-deposited material may be controlled, thereby controlling the porosity of the as-formed layer. Further explanation of oblique angle deposition for ITO may be found in at least "Light-Extraction Enhancement of GaInN Light Emitting Diodes by Graded-Refractive-Index Indium Tin Oxide Anti-Reflection Contact", Jong Kyu Kim et. al., Advanced Materials, 0000, 00, 1-5.

Figure 10B:
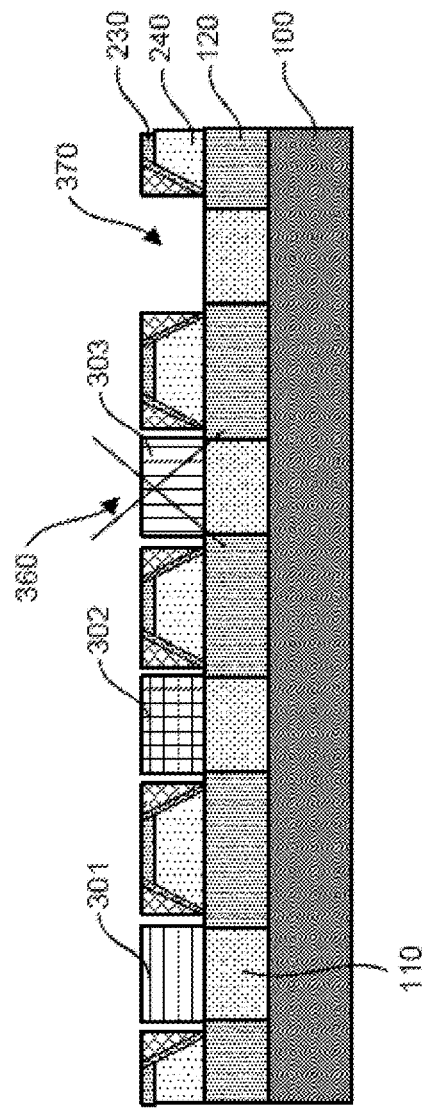

As illustrated in FIG. 10(b), certain slots are intentionally left as blank slots 370 to be fitted with a die of the required colour/specification at a later stage should one of the already installed die 360 be identified as sub-standard or otherwise non-functional. Accordingly, dies with sub-optimal performance can either be individually replaced, or intentionally damaged/deactivated and a corresponding die placed in the blank slot 370.

Figure 11:
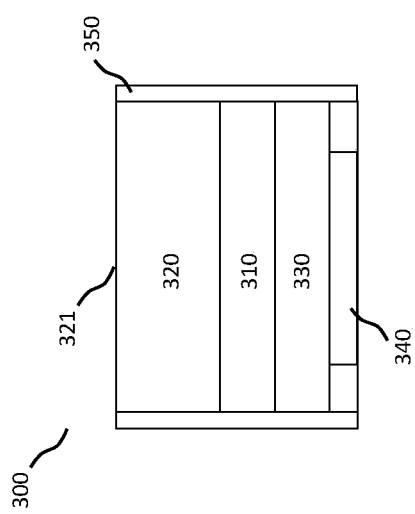
FIG. 11 shows an optical device according to an aspect of the present invention.

FIG. 11 shows an exemplary chip structure of the LED dies 300. As illustrated, the die is formed with a multilayer structure having an active layer 310 configured to emit light when exposed to an electrical current. The active layer 310 is sandwiched between an n-cladding layer 320 such as n-doped gallium nitride and a p-cladding layer 330 such as p-doped gallium nitride. In an embodiment the active layer 310 contains multiple quantum wells. In further embodiments, alternative die structures are used having alternative and/or additional layers. The skilled person would appreciate that any number of potential dies can be used providing they operate as described below. In a particular embodiment, the die 300 includes an electron blocking layer situated between the p-cladding layer 330 and the active layer 310. In a further embodiment, the die 300 includes one or more buffer layers. The die structure has a top light emitting surface 321. As is illustrated, a p-contact layer 340 is provided in contact with the p-cladding layer 320. In an embodiment, the p-contact layer 340 is formed of a reflective material. As can be seen from at least FIG. 9, the p-contact layer 340 forms a first electrical contact with the metal region 110 of the CMOS wafer, with a second electoral contact being made to the n-contact layer via the transparent conducting oxide layer 400. The sidewalls of the die are coated in a transparent, electrically insulating layer 350. In an embodiment, the transparent, electrically insulating layer is formed of silicon dioxide.

Figure 12:
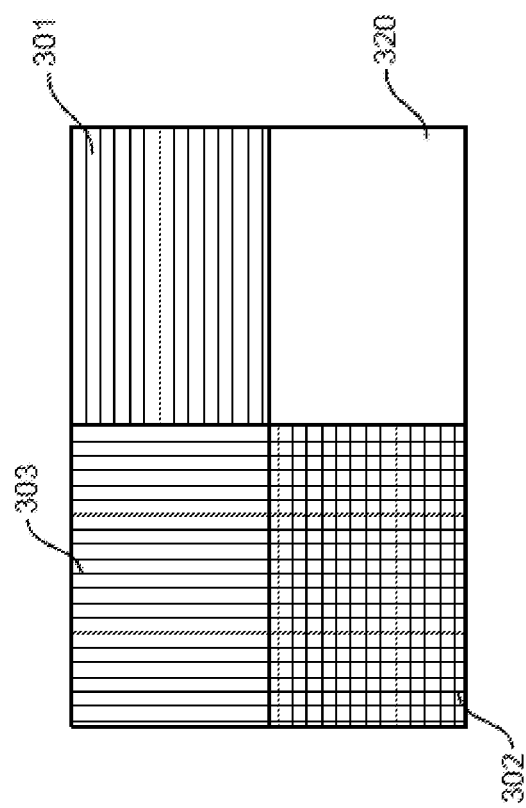
FIG. 12 shows the pixel configuration according to an aspect of the present invention.

FIG. 12 shows a top down view of one possible two-dimensional die configuration, with a blank slot 320 for redundancy purposes.

The above process produces an array of optical device 500 each consisting of a die 300 and the immediately neighboring spacers 220. An individual optical device 500 is shown in isolation in FIG. 13. For simplicity, only the active layer 310, n-cladding layer 320 and p-cladding layer 330 of the die 300 are shown. The columns of index matching material 305 are disposed between the die 300 and the internal faces of the spacers 220, with the reflective, electrically conducting material 230 disposed in the external faces of the spacers 220.

Figure 13:
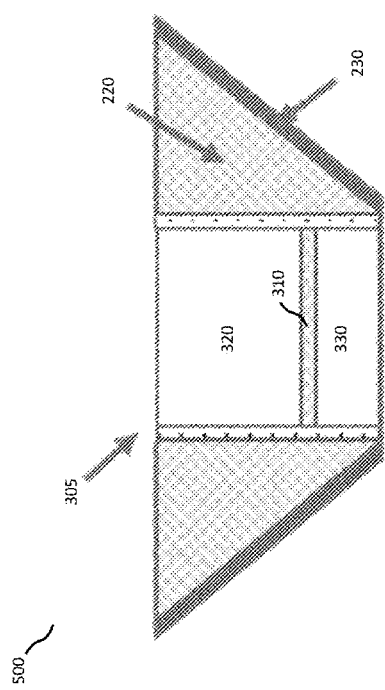
FIGS. 13-16 show various embodiments of optical devices according aspects of the present invention.
Figure 14:
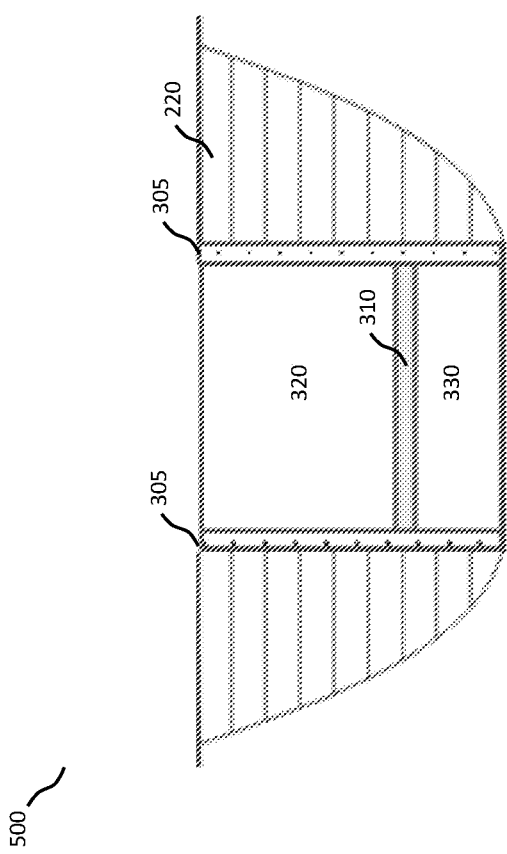

Whilst the spacers 220 are shown in FIG. 13 as having straight external faces angled outward relative to the internal faces and the sidewalls of the die 300, FIG. 14 depicts an alternative embodiment in which the external faces of the spacers 220 have a pseudo-parabolic profile. The external faces can have any suitable profile described by a range of Bézier curves having two control points and coefficients B—where B is any of 0.1, 0.5, 0.2 and 0.05. In a preferred embodiment, the Bézier coefficient is 0.5, resulting is approximately straight, outwardly sloping profile as shown in FIG. 13.

Figure 15:
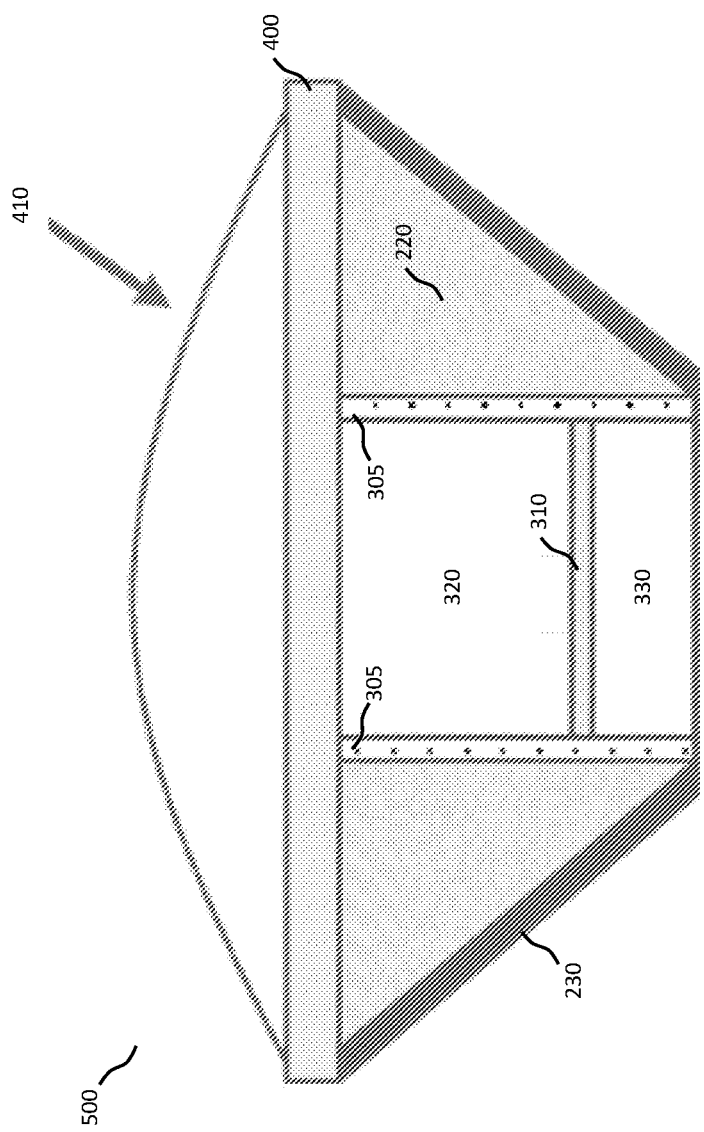

FIG. 15 depicts a further embodiment in which a light extraction feature 410 is formed above the light emitting surface of the die 300. Whilst the light extraction feature 410 is depicted in the form of a convex lens, the skilled person would appreciate that it may be provided in any suitable form depending on the application. In a preferred embodiment, the light extraction feature 410 is in the form of a lens having a radius of curvature of 3 μm. In an embodiment, the light extraction feature 410 is patterned into the transparent conducting oxide layer 400 itself. In an alternative embodiment, it is provided by a separate layer formed of a suitable transparent material, such as resin.

Figure 16:
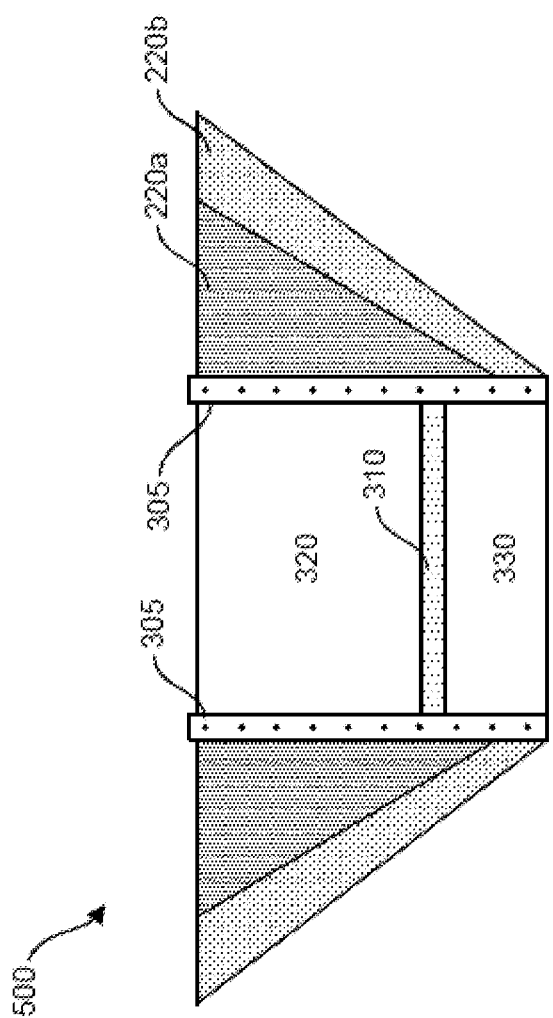
Figure 17A:
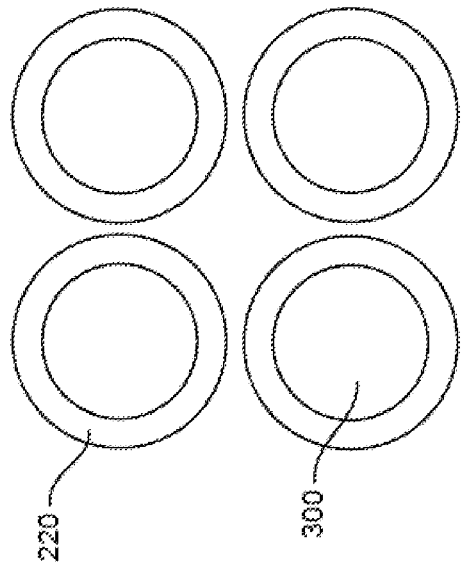
FIG. 17 shows embodiments wherein the optical device has a square (a), circular (b), triangular (c) and pentagonal (d) cross-section.
Figure 17B:
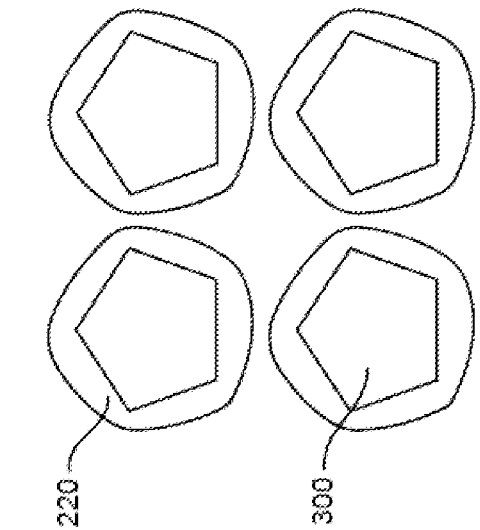
Figure 17C:
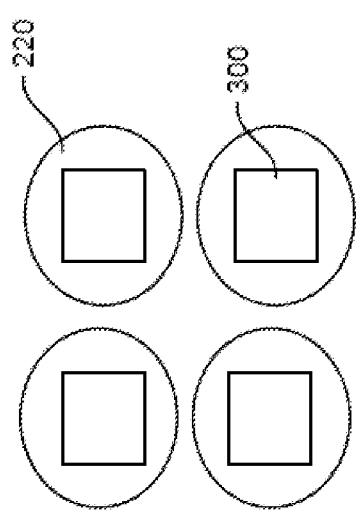
Figure 17D:
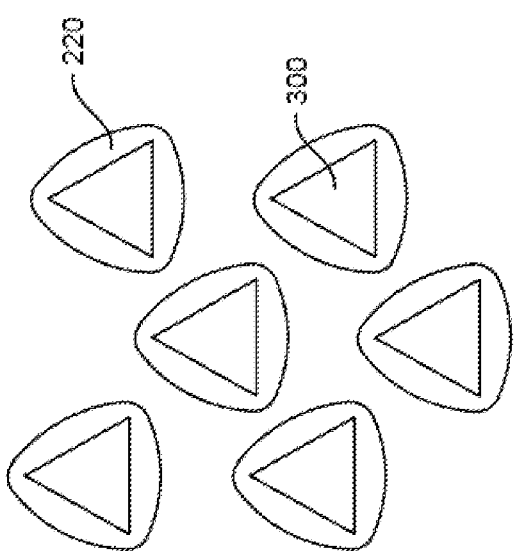

FIG. 16 depicts an embodiment in which the spacers 220 are each formed of an inner portion 220a and an outer portion 220b having refractive indices $n_1$ and $n_2$ respectively. In a preferred embodiment, $n_1 > n_2$ which can be achieved by using silicon nitride as the inner spacer material and aluminium oxide as the second spacer material. In a further embodiment, additional spacer layers can used with a decreasing index of refraction away from the sidewalls of the light emitting structure 300 (i.e. $n_1 > n_2 > n_N$). Whilst depicted as two separate spacers in schematic FIG. 16, the spacers can in fact be formed as a continuous layer, as shown in the cross-sectional views depicted in FIG. 17, with the dies 300 having any preferred cross-section shape providing a corresponding void is created in the spacers 220 such that the die 300 can be located.

It will be understood by the skilled person that the pseudo-parabolic spacers 220 of FIG. 14, the light extraction feature 410 of FIG. 14 and the compound spacer material of FIG. 16 are not mutually exclusive and can be combined into further embodiments having one or more or all of these features.

In use, a current is applied between the electrodes formed by the transparent conducting oxide 400 (in contact with the n-cladding layer 320 of the die 300) and the p-contact layer 340 on the bottom surface of the die 300, with the electrically conducting material 230 further operating as a current spreading layer. Light emitted by the active layer 310 is directed towards the light emitting top surface 321 either directly or i) via reflection from the electrical conducting material 230 on the external faces of the spacers 220, ii) via reflections and/or refractions at the spacers 220, iii) via the reflective p-contact layer 340 or iv) via multiple reflections within the structure including combinations of the above. Accordingly, the electrically conducting material 230, spacers 220 and reflective p-contact layer 340 are arranged to increase the proportion of light incident on the light emitting surface within the critical angular range to allow for transmission of light.

The claimed invention thus provides optical devices 500 having improved light collimation via a method of manufacture in which the sloped-profile spacers 220 are pre-formed on a substrate to receive dies 300—thereby allowing for defective dies to be replaced or deactivated in favour of previously redundant dies.

The invention claimed is:

1. A method of forming an optical device, the method comprising the steps of:
   (a) forming spacers on a sacrificial mesa, the mesa having substantially vertical sidewalls, the spacers being formed from a first electrically insulating, optically transparent material, and having an internal face facing the mesa sidewalls, and an opposing external face;
   (b) depositing a reflective, electrically conducting material so as to form a mirror layer on the external face of the spacers;
   (c) removing the sacrificial mesa so as to form a pocket between the internal faces of the spacers; and
   (d) installing a die having substantially vertical sidewalls into the pocket between the internal faces of the spacers.

2. The method of claim 1 wherein the external faces of the spacers are angled relative to the internal faces.

3. The method of claim 2 wherein the external faces of the spacers have a pseudo-parabolic profile.

4. The method of claim 2 wherein the external faces of the spacers have a profile that approximates a Bézier curve having two control points with a Bézier coefficient of 0.5.

5. The method of claim 1 wherein the spacers are formed of silicon nitride, silicon oxide or tin oxide.

6. The method of claim 1 further comprising depositing a transparent conducting oxide over the die and spacers.

7. The method of claim 6 wherein the transparent conducting oxide is indium tin oxide.

8. The method of claim 6 wherein the transparent conducting oxide forms an electrical contact to the die, and a second electrical contact is formed on an opposing surface of the die.

9. The method of claim 1 further comprising the step of forming a light extraction feature on the transparent conducting oxide above the underlying die.

10. The method of claim 9 wherein the light extraction feature is in the form of convex lens.

11. The method of claim 1 further comprising the step of depositing a second electrically insulating, optically transparent material on the external face of each of the spacers, the second electrically insulating, optically transparent material having a different refractive index to that of the first electrically insulating, optically transparent material.

12. The method of claim 11 wherein the refractive index of the first material is greater than that of the second material.

13. The method of claim 1 further comprising the step of applying index-matching material filler between the die and the internal faces of the spacers.

14. The method of claim 1 wherein the sacrificial mesa is first created by forming two trenches either side of a designated region in a layer of sacrificial material.

15. The method of claim 14 wherein the reflective, electrically conductive material is further deposited along an exposed bottom portion of each of the trenches.

16. The method of claim 15 further comprising the step of filling the trenches with an insulating material.

17. The method of claim 1 wherein the die comprises an n-doped layer, a p-doped layer, and an active region configured to emit light when electrical current is applied to the die.

18. The method of claim 1 wherein the sidewalls of the die are coated in an optically transparent, electrically insulating material.

19. An optical device manufactured according to steps (a)-(c) of method claim 1.

20. The optical device of claim 19 manufactured according to the method of claim 1.

* * * * *